(12) United States Patent
Nakamura et al.

(10) Patent No.: US 6,212,120 B1
(45) Date of Patent: Apr. 3, 2001

(54) SEMICONDUCTOR MEMORY DEVICE WITH LESS POWER CONSUMPTION

(75) Inventors: Noritsugu Nakamura; Yoshiharu Aimoto, both of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/576,781

(22) Filed: May 23, 2000

(30) Foreign Application Priority Data

May 26, 1999  (JP) ................................................. 11-147281

(51) Int. Cl.[7] ....................................................... G11C 7/12
(52) U.S. Cl. .......................... 365/227; 365/226; 365/190; 365/203; 365/204; 365/194
(58) Field of Search .................................... 365/227, 226, 365/190, 203, 204, 194, 191

(56) References Cited

U.S. PATENT DOCUMENTS 5,714,893 * 2/1998 Aimoto et al. .......................... 327/51
5,841,718 * 11/1998 Watters et al. ........................ 365/208
5,894,443 * 4/1999 Sagoh .................................... 365/203

FOREIGN PATENT DOCUMENTS

| 5-159581 | 6/1993 | (JP) | ............................. G11C/11/417 |
| 5-205473 | 8/1993 | (JP) | ............................. G11C/11/409 |
| 8-7569 | 1/1996 | (JP) | ............................. G11C/11/409 |
| 9-17183 | 1/1997 | (JP) | ............................... G11C/11/41 |
| 10-134573 | 5/1998 | (JP) | ............................. G11C/11/409 |

* cited by examiner

*Primary Examiner*—Andrew Q. Tran
(74) *Attorney, Agent, or Firm*—Hayes, Soloway, Hennessey, Grossman & Hage, P.C.

(57) ABSTRACT

A semiconductor memory device includes a pair of data lines, a precharging and equalizing circuit, a setting circuit and a data write circuit. The precharging and equalizing circuit is provided between the data lines to equally precharge the data lines to a first voltage in response to a precharge and equalize signal. The setting circuit is provided between the data lines to set one of the precharged data lines to a second voltage in response to data signals. The second voltage is lower than the first voltage. Also, a data Is written to a memory cell based on the second voltage of the one precharged data line and the first voltage of the other precharged data line. The data write circuit supplies the data signals to the setting circuit based on the data.

21 Claims, 9 Drawing Sheets

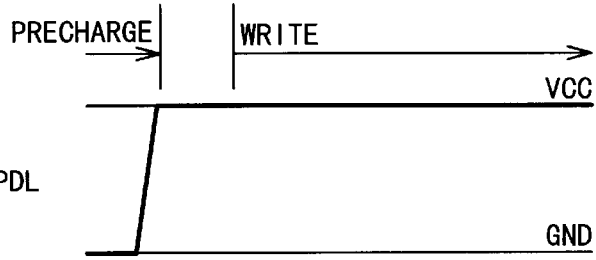
Fig. 2A PRIOR ART PDL
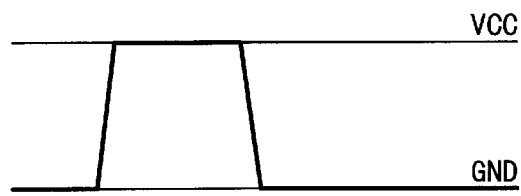
Fig. 2B PRIOR ART BSL
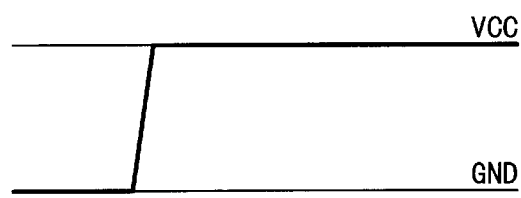
Fig. 2C PRIOR ART WE
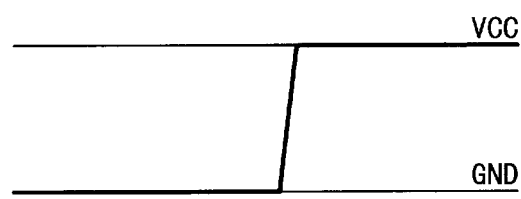
Fig. 2D PRIOR ART YSW
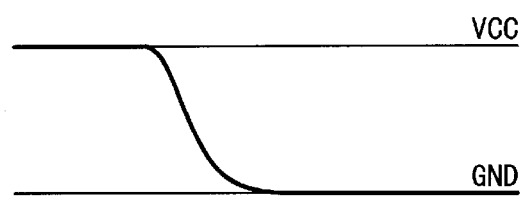
Fig. 2E PRIOR ART DLT OR DLN

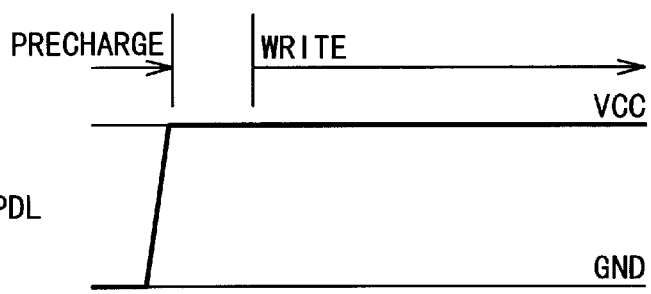
Fig. 4A  PDL
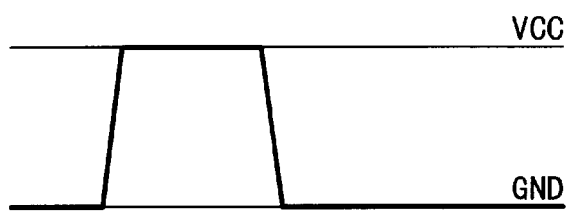
Fig. 4B  BSL
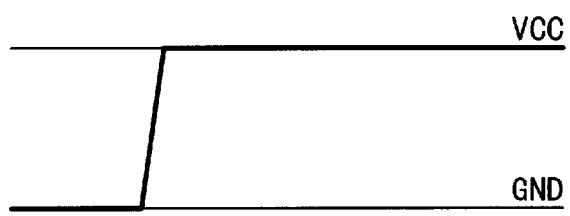
Fig. 4C  WE
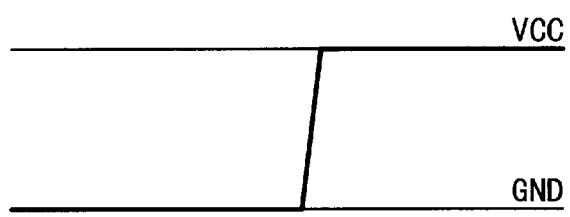
Fig. 4D  YSW
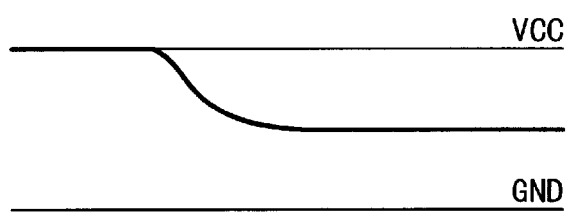
Fig. 4E  DLT OR DLN

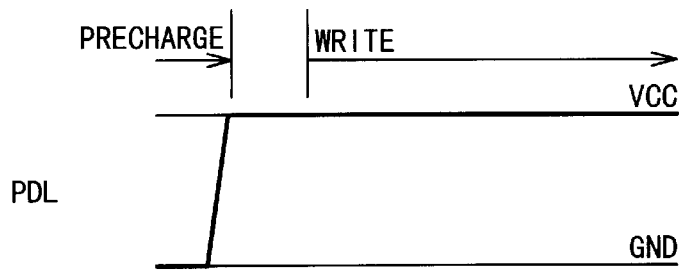
Fig. 6A  PDL
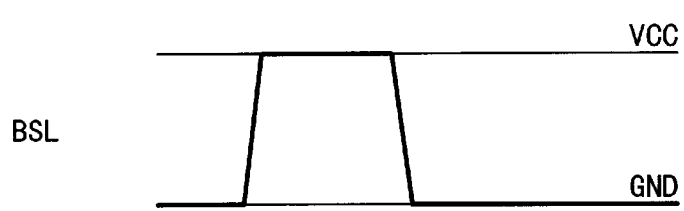
Fig. 6B  BSL
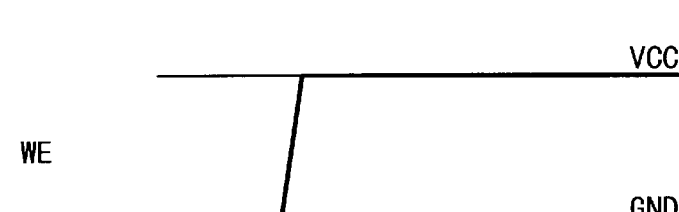
Fig. 6C  WE
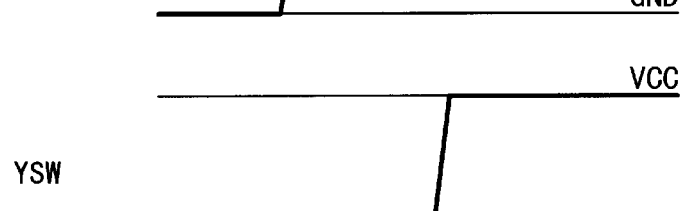
Fig. 6D  YSW
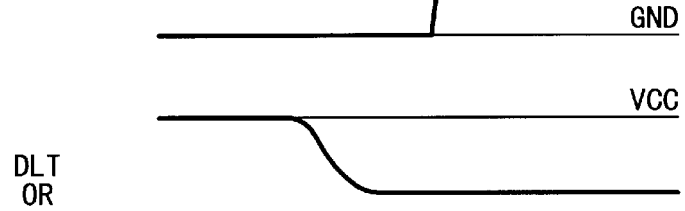
Fig. 6E  DLT OR DLN
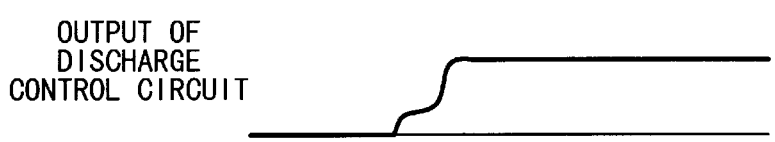
Fig. 6F  OUTPUT OF DISCHARGE CONTROL CIRCUIT

SEMICONDUCTOR MEMORY DEVICE WITH LESS POWER CONSUMPTION

BACKGROUND OF THE INVENTION

1. Field of the Invention

The present invention relates to a semiconductor memory device.

2. Description of the Related Art

In recent years, a semiconductor memory device is required in higher operation speed and lower power consumption to realize a highly efficient system. However, as a chip scale became large, the length of a signal line increases so that the increase of a wiring line capacity prevents the high speed operation and the low power consumption. For this reason, in the conventional semiconductor memory device, a memory array is divided into multiple sections to shorten wiring lines such as bit lines and word lines. Thus, the wiring line capacity is reduced so that the high speed operation and the low power consumption are attained.

However, with the further increase of integration, the wiring line capacity increases again.

Also, in a memory system in recent years, because of the improvement of system performance, many input/output lines are used and the power consumption tends to increase in case of driving of data lines.

Moreover, in the conventional semiconductor memory device, a write data signal has the amplitude of a power supply voltage while a read data signal has a small amplitude.

FIG. 1 is a block diagram showing the structure of a conventional semiconductor memory device. Referring to FIG. 1, the conventional semiconductor memory device is composed of a write control circuit and a multiple of memory array sections. The write control circuit is composed of a pair of data lines DLT and DLN, a precharging and equalizing circuit 2, a transfer gate circuit 3, and a data line selecting circuit 4. The data lines DLT and DLN are write data lines for data transfer to a memory block 1. The precharging and equalizing circuit 2 equalizes the data lines DLT and DLN in voltage. The transfer gate circuit 3 connects either of the data lines DLT and DLN to a ground (GND) voltage. The data line selecting circuit 4 controls the transfer gate circuit 3.

The memory block 1 is composed of a memory array 1a, a sense amplifier section 1b, a transfer gate 1c, and a transfer gate 1d. The transfer gate 1c controls the connection of the data lines DLT and DLN to the sense amplifier section 1b in response to a write block selecting signal BSL. The transfer gate 1d controls the sense amplifier section 1b and the memory array 1a in response to a bit line selecting signal YSW.

Next, the operation of the conventional semiconductor memory device will be described with reference to timing charts shown in FIGS. 2A to 2E. The conventional semiconductor memory device is a precharging system by a power supply voltage Vcc.

First, before a writing operation to the memory block 1 is started, a precharge and equalize control signal PDL is set to a low level or a ground (GND) level, as shown in FIG. 2A. As a result, the data lines DLT and DLN are precharged to the power supply voltage VCC. At this time, the bit line portions connected to the sense amplifier section 1b are also precharged to the power supply voltage VCC.

In the writing operation to the memory block 1, the precharge and equalize control signal PDL set to a high level to deactivate the precharging and equalizing circuit 2 for the data lines DLT and DLN, as shown in FIG. 2A. Subsequently, the transfer gate 1c is activated in response to a write block selecting signal BSLn, as shown in FIG. 2B. Thus, the memory block 1 is selected. In this way, the memory block 1 as an object of the writing operation is selected. Then, the data line selecting circuit 4 selects the data lines DLT and DLN in accordance with an input data, and sets one of the data lines DLT and DLN to the GND potential in response to a write enable signal WE shown in FIG. 2C to transfer the input data to the sense amplifier section 1b. Thereafter, the transfer gate 1c is deactivated in accordance with the write block selecting signal BSL, as shown in FIG. 2B. Subsequently, the transfer gate 1d is activated in response to a bit line select signal YSW shown in FIG. 2D. Thus, the memory array 1a and the sense amplifier section 1b are connected so that the data is written in a memory cell.

However, in the conventional semiconductor memory device, the data lines DLT and DLN with large wiring line capacities is driven from the power supply voltage level to the GND level in the writing operation. Therefore, the power consumption is large.

In conjunction with the above description, a dynamic RAM is disclosed in Japanese Laid Open Patent Application (JP-A-Heisei 5-205473). In this reference, switches Q18 and Q19 are provided to connect common source line (PS1) and common data lines (CD1 and /CD1) not only for non-selection period of a memory array (M-ARY1) but also for a selection period. The common source line (PS1) supplies a power supply voltage (Vcc) and a ground voltage (Vss) to a sense amplifier circuit (SA1). The common data lines (CD1 and /CD1) correspond to the memory array (M-ARY1) in which a memory cell to be selected is present. A precharging circuit (PCEQ1) precharges the common source lines (PS1 and NS1) to a predetermined precharge voltage for a non-selection period of the sense amplifier circuit (SA1). When the switches (Q18 and Q19) are turned on, the sense amplifier circuit (SA1) is activated and the common source line (PS1) is increased in voltage from a half precharge level to a Vcc level, the common data lines (CD1 and /CD1) is also increased in voltage.

Also, a write circuit of a random access memory is disclosed in Japanese Laid Open Patent Application (JP-A-Heisei 5-159581). In this reference, when a write control signal (WE) is set to a high level so that a write enable state is established, NMOS transistors (43, 44, 51 and 53) are turned on. When a write data signal D of the high level is supplied, a write data signal Da of a low level and a write data signal Db of the high level are outputted from inverters (41 and 42), respectively. The write data signals Da and Db are transferred to bit lines BLa and BLb via the NMOS transistors 43 and 44, respectively. At this time, the NMOS transistor (52) is turned on in response to the write data signal Db of the high level, so that the voltage of the bit line (BLa) is quickly decreased to the low level via the NMOS transistors (51 and 52). In this way, the high speed writing operation of data in the memory cell is attained.

Also, a semiconductor memory device is disclosed in Japanese Laid Open Patent Application (JP-A-Heisei 8-007569). In this reference, a precharging circuit (6) is activated before a reading operation of a cell data from a memory cell (2) and precharges a bit line BL. A voltage dropping circuit (5) is selectively activated in the precharging operation to the bit line (BL) by the precharging circuit (6) and limits a charge quantity to the bit line (BL). Also, a charge compensating circuit (3) supplies charge to the bit line (BL) for an interval from the time when the charge is injected by the precharging circuit (6) to the time when the charge on the bit line (BL) is discharged by a cell data of the memory cell (2).

Also, a semiconductor memory device is disclosed in Japanese Laid Open Patent Application (JP-A-Heisei 9-017183). In this reference, a clamp transistor (Pcr-0) has a threshold voltage Vthp. The clamp transistor (Pcr-0) precharges bit lines BIT-0 and BIT-1 to a precharge voltage (VDD-|Vthp|) when transistors Pprc-0 and Pprc-1 are set to a conductive state. A claim transistor Pcr-1 has the same threshold voltage Vthp as the clamp transistor (Pcr-0). Inverters 23 and 24 in a write circuit (3) output the precharge voltage (VDD-|Vthp|) as "H" level and the ground voltage as "L" level to input lines (WD-0 and WD-1) based on input data (DIN-0 and DIN-1).

Also, a semiconductor memory device is disclosed in Japanese Laid Open Patent Application (JP-A-Heisei 10-134573). In this reference, a main amplifier circuit and a write amplifier circuit operate in a first positive voltage to selectively drive two I/O buses to a second positive voltage for precharge. The main amplifier circuit (130) is composed of a precharging circuit (134) and an activating circuit (132). The precharging circuit (134) separates two I/O buses and precharges the two I/O buses. The activating circuit (132) generates a signal to activate a first section of the main amplifier circuit (130). The signal makes the first section enable such that the two I/O signals are precharged, only when the two I/O buses are separated.

SUMMARY OF THE INVENTION

Therefore, an object of the present invention is to provide a semiconductor memory device in which power consumption can be reduced when a data is written in a memory block.

Another object of the present invention is to provide a semiconductor memory device in which a data writing operation can be carried out at a high speed.

In order to achieve an aspect of the present invention, a semiconductor memory device includes a pair of data lines, a precharging and equalizing circuit, a setting circuit and a data write circuit. The precharging and equalizing circuit is provided between the data lines to equally precharge the data lines to a first voltage in response to in response to a precharge and equalize signal. The setting circuit is provided between the data lines to set one of the precharged data lines to a second voltage in response to data signals. The second voltage is lower than the first voltage. Also, a data is written a memory cell based on the second voltage of the one precharged data line and the first voltage of the other precharged data line. The data write circuit supplies the data signals to the setting circuit based on the data.

The setting circuit may includes a transfer gate provided between the data lines and including two transistors connected in series between the data lines, wherein gates of the two transistors are supplied with the data signals, and a discharge control circuit setting a voltage of a node between the two transistors to the second voltage.

Also, the setting circuit may includes a transfer gate provided between the data lines and including two transistors connected in series between the data lines, wherein gates of the two transistors are supplied with the data signals, and a discharge control circuit setting a voltage of a node between the two transistors to the second voltage in response to a control signal. In this case, the discharge control circuit includes a voltage dropping circuit generating the second voltage from the first voltage, and an inverter setting the voltage of the node to the second voltage in response to the control signal.

Also, the setting circuit may includes a transfer gate provided between the data lines and including two transistors connected in series between the data lines, wherein gates of the two transistors are supplied with the data signals, and a discharge control circuit setting a voltage of a node between the two transistors to the second voltage in response to a control signal. In this case, the discharge control circuit includes a voltage dropping circuit generating the second voltage from the first voltage, an inverter setting the voltage of the node to the second voltage in response to a period indication signal, and a period control circuit generating the period indication signal from the control signal to indicates a time period during which the one precharged data line is set to the second voltage.

The data write circuit may supply the data signals to the setting circuit based on the data in response to a write control signal. In this case, the setting circuit includes a transfer gate provided between the data lines and including two transistors connected in series between the data lines, wherein gates of the two transistors are supplied with the data signals, and a discharge control circuit setting a voltage of a node between the two transistors to the second voltage in response to the write control signal. In this case, the discharge control circuit may include a voltage dropping circuit generating the second voltage from the first voltage, an inverter setting the voltage of the node to the second voltage in response to a period indication signal, and a period control circuit generating the period indication signal from the write control signal to indicates a time period during which the one precharged data line is set to the second voltage.

Here, the first voltage may be a power supply voltage, and the second voltage may be substantially equal to ½ of the power supply voltage.

Also, the first voltage may be a voltage lower than a power supply voltage by a threshold voltage of a transistor of the precharging and equalizing circuit, and the second voltage may substantially equal to ½ of a power supply voltage.

Also, the first voltage is substantially equal to ½ of a power supply voltage.

In order to achieve another aspect of the present invention, a method of writing a data in a semiconductor memory device, is attained by equally precharging a pair of data lines to a first voltage in response to a precharge and equalize signal; by supplying data signals based on the data in response to a write control signal; by setting one of the precharged data lines to a second voltage in response to the data signals, the second voltage being lower than the first voltage; and by sensing voltages on the data lines to write the data in a memory cell based on the sensed voltages.

The setting may be attained by supplying the data signals to gates of two transistors which are connected in series between the data lines; and by connecting a node between the two transistors to the second voltage. Instead, the setting is attained by supplying the data signals to gates of two transistors which are connected in series between the data lines; and by connecting a node between the two transistors to the second voltage in response to a control signal. In addition, the setting may be attained by supplying the data signals to gates of two transistors which are connected in series between the data lines; by generating a period indication signal from a control signal to indicates a time period during which the one precharged data line is set to the second voltage; and by setting the voltage of the node to the second voltage in response to a period indication signal. Otherwise, the setting may be attained by supplying the data signals to gates of two transistors which are connected in series between the data lines; by generating a period indication signal from said write control signal to indicates a time period during which the one precharged data line is set to the second voltage; and by setting a voltage of a node between the two transistors to the second voltage in response to the write control signal.

Also, the first voltage may be substantially equal to a power supply voltage, or substantially equal to ½ of the power supply voltage. Also, the second voltage may be substantially equal to ½ of the first voltage.

BRIEF DESCRIPTION OF THE DRAWINGS

FIGS. 2A to 2E are timing charts showing signal waveforms at various sections of the conventional semiconductor memory device;

FIGS. 4A to 4E are timing charts showing signal waveforms at various sections of the semiconductor memory device according to the first embodiment of the present invention;

FIGS. 6A to 6F are timing charts showing signal waveforms at various sections of the semiconductor memory device according to the second embodiment of the present invention;

DESCRIPTION OF THE PREFERRED EMBODIMENTS

Hereinafter, a semiconductor memory device of the present invention will be described with reference to the attached drawings.

Figure 1:
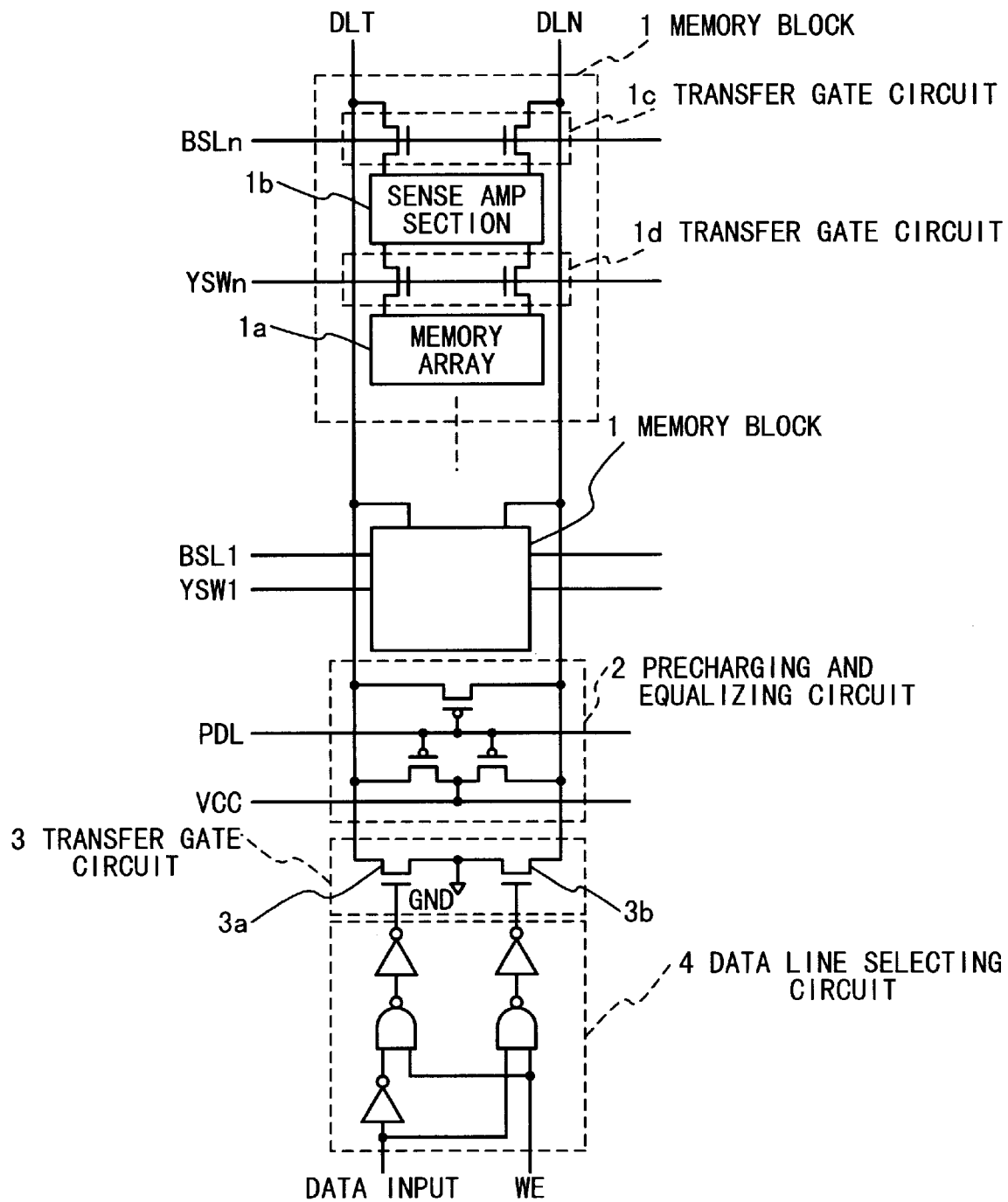
FIG. 1 is a block diagram showing the structure of a conventional semiconductor memory device.
Figure 3:
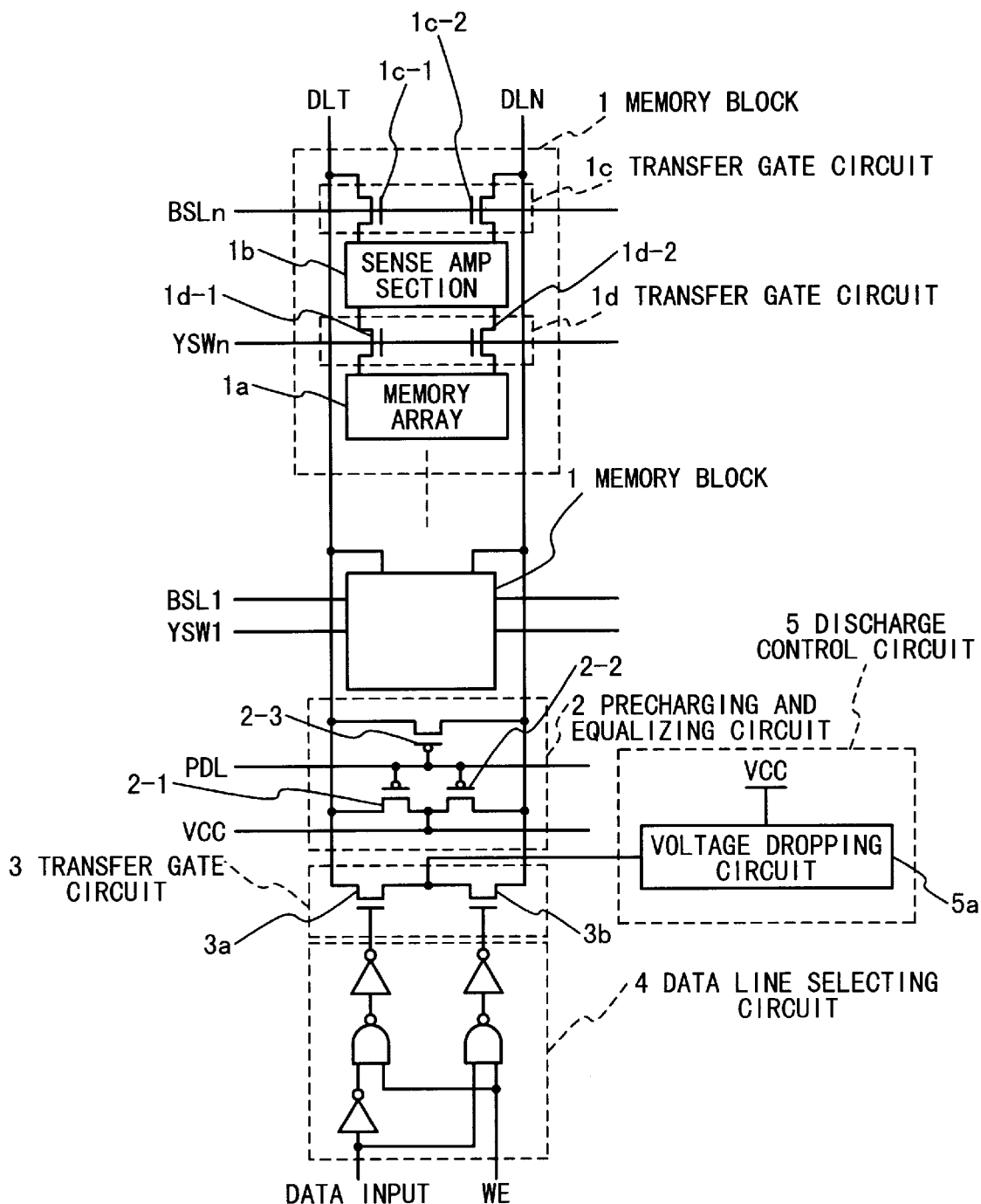
FIG. 3 is a block diagram showing the structure of a semiconductor memory device according to a first embodiment of the present invention.

FIG. 3 is a block diagram showing the semiconductor memory device according to the first embodiment of the present invention. Referring to FIG. 3, the semiconductor memory device in the first embodiment is composed of a write control circuit and a plurality of memory blocks 1.

The write control circuit is composed of a pair of data lines DLT and DLN, a precharging and equalizing circuit 2, a transfer gate circuit 3, a data line selecting circuit 4, and a discharge control circuit. The data lines DLT and DLN are data lines for data transfer to a memory block 1.

The precharging and equalizing circuit 2 is three PMOS transistors. One of the PMOS transistor is provided between the data lines DLT and DLN and its gate is connected to a precharge and equalize control signal PDL. The remaining two PMOS transistors are connected in series and provided between the data lines DLT and DLN. The gates of the remaining two PMOS transistors are connected to the precharge and equalize control signal PDL. A node between the remaining two transistors is connected to a power supply voltage Vcc. The precharging and equalizing circuit 2 precharges the data lines DLT and DLN to the power supply voltage Vcc through the remaining two transistors in response to the precharge and equalize control signal PDL. At the same time, the voltages of the data lines DLT and DLN are equalized through the PMOS transistor in response to the precharge and equalize control signal PDL.

The data line selecting circuit 4 is composed of first to third inverters and first and second NAND gates. A data signal is supplied to the first inverter and the second NAND gate. The first inverter inverts the data signal to supply to the first NAND gate. A write enable signal as a write control signal is supplied to the first and second NAND gates. The outputs of the first and second NAND gates are supplied to the second and third inverters, respectively. The second and third inverters invert data signal supplied from the first and second NAND gates to produce supply data signals.

The transfer gate circuit 3 is composed of two NMOS transistors connected in series between the data lines DLT and DLN. A node between the two NMOS transistors is connected to the discharge control circuit 5. The gates of the two NMOS transistors are connected to the second and third inverters of the data line selecting circuit 4. As a result, when the data signal supplied to the data line selecting circuit 4 is in a high level, the data signal of the low level is supplied to the NMOS transistor of the transfer gate circuit 3 on the data line DLT. On the other hand, when the data signal supplied to the data line selecting circuit 4 is in a low level, the data signal of the high level is supplied to the NMOS transistor of the transfer gate circuit 3 on the data line DLT. The NMOS transistor of the transfer gate circuit 3 on the data line DLN is supplied with a signal with a complementary signal to the NMOS transistor on the data line DLT.

The discharge control circuit 5 is composed of a voltage dropping circuit 5a. The voltage dropping circuit 5a generates a predetermined discharge voltage from the power supply voltage Vcc and supplied to the node between the NMOS transistors of the transfer gate circuit 3.

The plurality of memory blocks 1 are connected to the data lines DLT and DLN. Each of the plurality of memory blocks 1 is composed of a memory array 1a, a sense amplifier section 1b, a transfer gate circuit 1c, and a transfer gate circuit 1d.

The transfer gate circuit 1c is composed of two NMOS transistors. The transfer gate circuit 1c connects the data lines DLT and DLN to the sense amplifier section 1b in response to a write block selecting signal BSL.

The transfer gate circuit 1d is composed of two NMOS transistors. The transfer gate circuit 1d connects the sense amplifier section 1b and the memory array 1a in response to a bit line selecting signal YSW.

Next, the operation of the semiconductor memory device in the first embodiment will be described with reference to timing charts shown in FIGS. 4A to 4E. The semiconductor memory device is of a power supply voltage precharging type.

First, before a writing operation to the memory block 1 is started, a precharge and equalize control signal PDL is set to a low level or a ground (GND) level, as shown in FIG. 4A. As a result, the data lines DLT and DLN are precharged to the power supply voltage Vcc. At this time, the bit line portions connected to the sense amplifier section 1*b* are also precharged to the power supply voltage Vcc.

Next, in the writing operation to the memory block 1, the precharge and equalize control signal PDL set to a high level to deactivate the precharging and equalizing circuit 2 for the data lines DLT and DLN, as shown in FIG. 4A. Subsequently, the transfer gate 1*c* is activated in response to the write block selecting signal BSLn, as shown in FIG. 4B. Thus, the memory block 1 is selected. In this way, the memory block 1 as an object of the writing operation is selected. Then, the data line selecting circuit 4 selects the data lines DLT and DLN based on an input data signal in response to a write enable signal WE shown in FIG. 4C, and sets one of the data lines DLT and DLN to a discharge voltage outputted from the voltage dropping circuit 5*a* of the discharge control circuit 5. Then, the data signals are transferred from the data line selecting circuit 4 to the sense amplifier section 1*b* through the transfer gate circuit 3.

When the data signals are transferred to and sensed by the sense amplifier section 1*b*, the transfer gate circuit 1*c* is deactivated in response to the write block selecting signal BSL. Subsequently, the transfer gate circuit 1*d* is activated. Thus, the memory array 1*a* and the sense amplifier section 1*b* are connected to write the data corresponding to the data signal supplied to the data line selecting circuit 4 in a memory cell of the memory array 1*a*.

It should be noted that the amplitude of the data signal on the data lines DLT or DLN is limited by the discharge control circuit 5 so that the amplitude of the data signal is small. Thus, the power consumption on the data lines is proportional to the square of the amplitude of the signal on the data line and the wiring line capacity. Therefore, the power consumption can be largely reduced, compared with the case that the node between the NMOS transistors 3*a* and 3*b* is connected to the GND voltage such that the charges on the data lines DLT and DLN is discharged.

Figure 5:
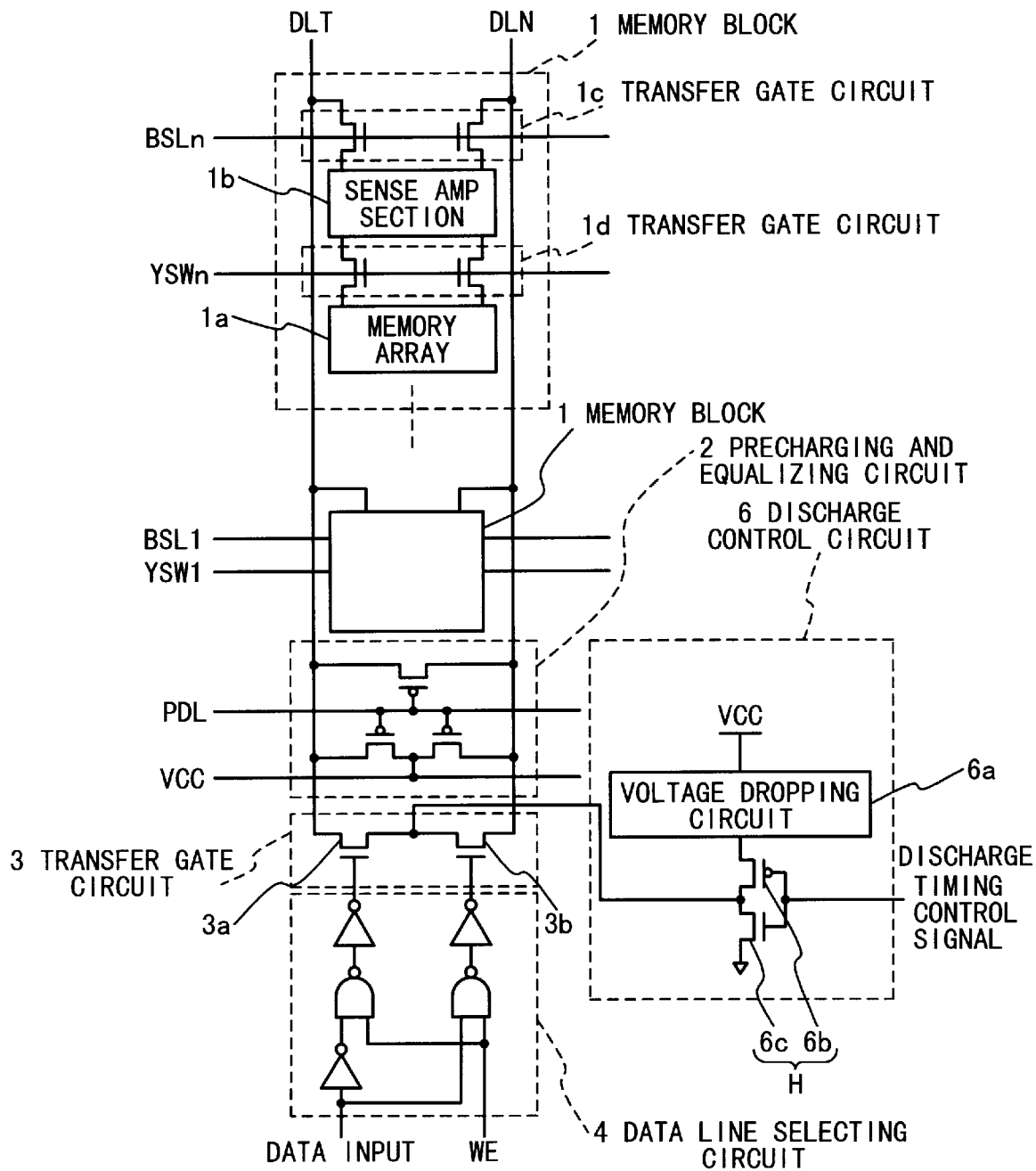
FIG. 5 is a block diagram showing the structure of the semiconductor memory device according to a second embodiment of the present invention.

FIG. 5 shows a block diagram showing the structure of the semiconductor memory device according to the second embodiment of the present invention. The structure of the semiconductor memory device in the second embodiment is basically the same as that of the semiconductor memory device in the first embodiment. The semiconductor memory device in the second embodiment is different from the semiconductor memory device in the first embodiment in the following points. That is, a discharge control circuit 6 is provided in place of the discharge control circuit 5 which supplies a predetermined discharge voltage to the node between the NMOS transistors of the transfer gate circuit 3 to discharge the charge on the data lines DLT and DLN. The discharge control circuit 6 outputs the ground level to the node between the NMOS transistors. The discharge control circuit 6 outputs a predetermined discharge voltage to the node for the writing operation.

The discharge control circuit 6 is composed of a voltage dropping circuit 6*a* and inverter H. The inverter H is composed of a PMOS transistor 6*b* having a source connected the voltage dropping circuit 6*a* and an NMOS transistor 6*c* having a source connected with the GND voltage. In the inverter H as a discharging adjusting circuit, a discharging timing control signal is supplied to the gates of the transistors 6*b* and 6*c*.

Next, the writing operation of the data will be described with reference to the timing charts of FIGS. 6A to 6F.

The operation of the semiconductor memory device in the second embodiment is basically the same as that of the semiconductor memory device in the first embodiment. Therefore, the operation of the semiconductor memory device in the second embodiment which is different from the semiconductor memory device in the first embodiment will be described below.

In the discharging operation, the voltage at the node between the transistors of the transfer gate circuit 3 is changed from the GND voltage to the discharge voltage for the writing operation.

The output voltage of the discharge control circuit 6 is set to the GND voltage at an initial state. When the data lines DLT and DLN are selected by the data line selecting circuit 4, a sufficient voltage is applied between the node between the NMOS transistors of the transfer gate circuit 3. When the discharging operation is started, the output voltage of the discharge control circuit 6 changes. Thus, the high speed operation and the low power consumption can be realized in the semiconductor memory device. In order to control the output voltage of the discharge control circuit 6, the discharge timing control signal is set to the low level until the write control signal is selected, and then is set to the high level after the write control signal is selected. It is desirable that the discharge timing control signal is set to the low level again after the write block selecting signal BSL changes to the low level.

Figure 7:
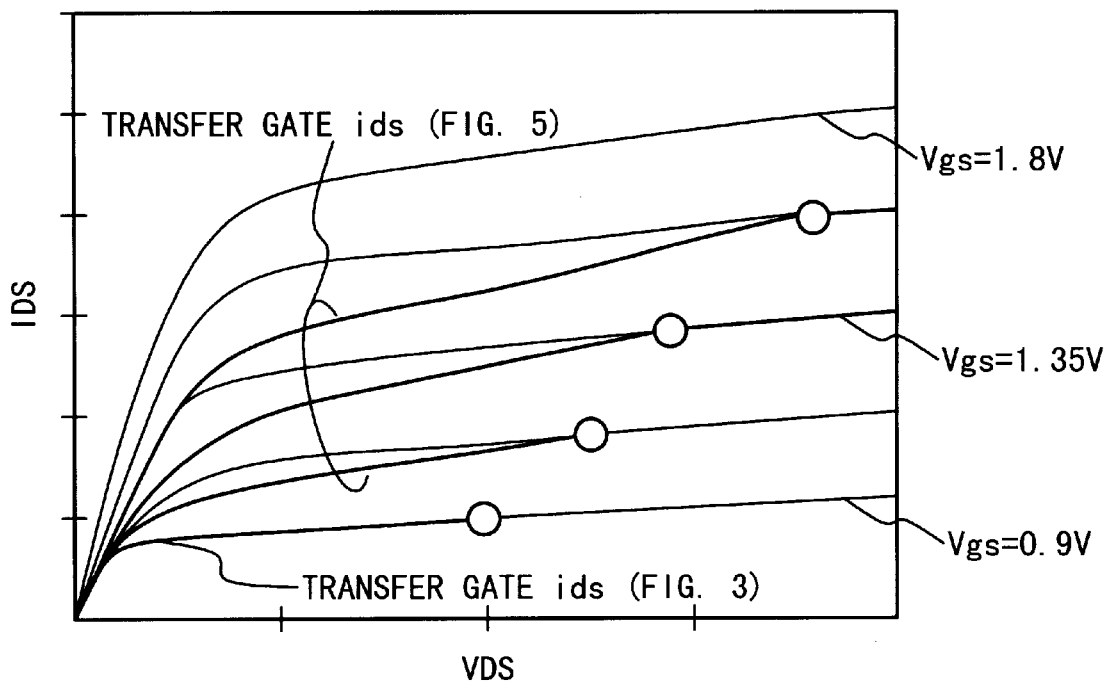
FIG. 7 is a graph showing drain current Ids characteristic of the transfer gate in a data writing operating data in the present invention.

FIG. 7 shows a relation between drain current Ids and source-drain voltage Vds and the drain current Ids of each of the NMOSFETs 3*a* and 3*b*. In this example, the power supply voltage Vcc is 1.8 V and the discharging resultant level is Vcc/2.

In FIG. 7, the drain current Ids flowing through the transfer gate circuit 3 changes in accordance with the discharge timing control signal and the gate width of the NMOS transistor 6*c* of the discharge control circuit 6. Compared with the drain current Ids flowing through the transfer gate circuit 3 in FIG. 3, the drain current Ids flowing through the transfer gate circuit 3 is always larger. Therefore, the charge on the data lines can be quickly discharged and the writing operation can be carried out at high speed.

Figure 8:
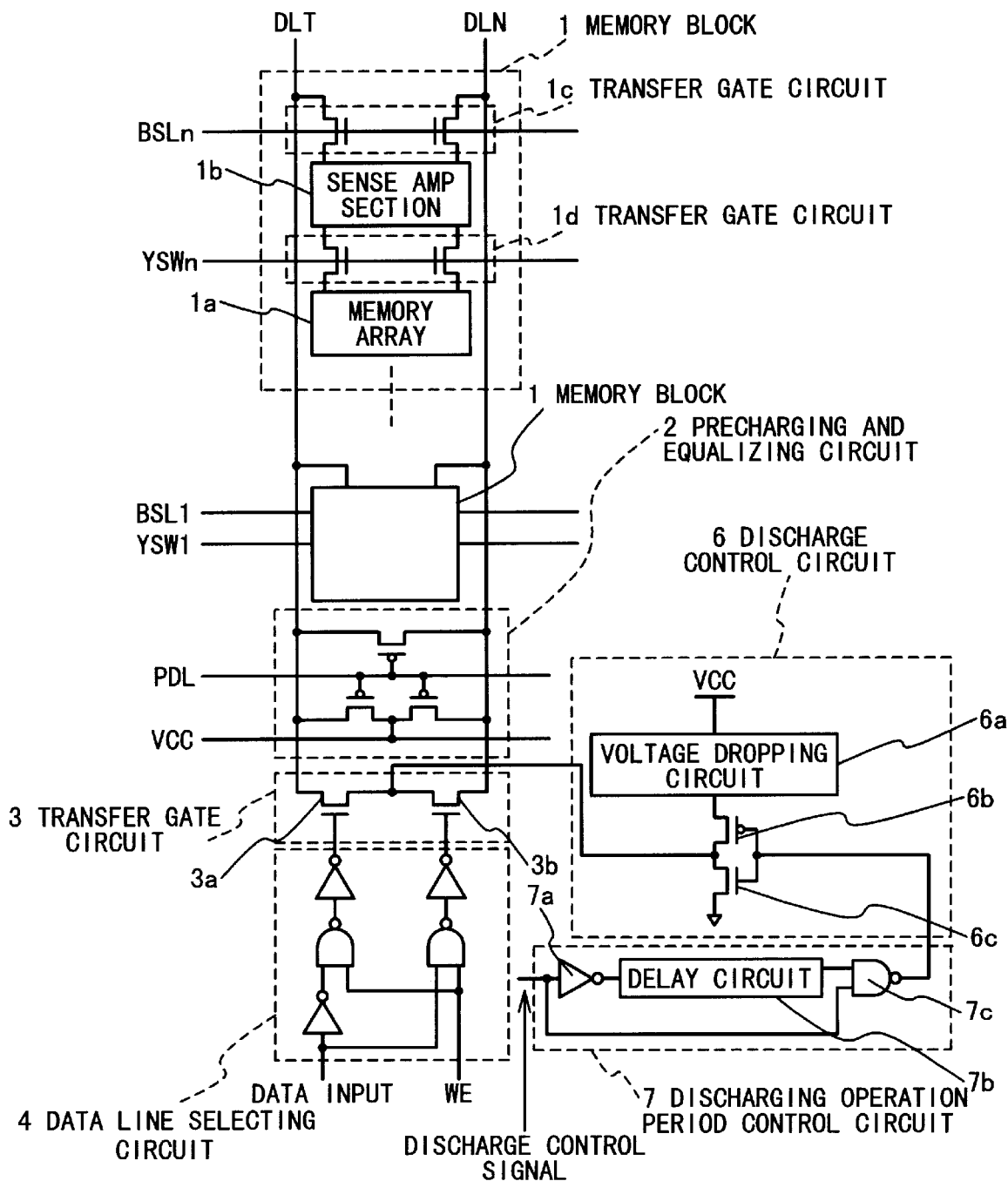
FIG. 8 is a block diagram showing the structure of the semiconductor memory device according to a third embodiment of the present invention.

FIG. 8 shows a block diagram showing the structure of the semiconductor memory device according to the third embodiment of the present invention. The structure of the semiconductor memory device in the third embodiment is basically the same as that of the semiconductor memory device in the second embodiment. The semiconductor memory device in the third embodiment is different from the semiconductor memory device in the second embodiment in the following points. That is, a discharge period control circuit 7 is added to the discharge control circuit 6. The discharge period control circuit 7 gives a signal to the discharge control circuit 6 to limit a discharging period.

The discharge period control circuit 7 is composed of an inverter 7*a* for inverting the discharge control signal, a delay circuit 7*b* for delaying the inverted discharge control signal and a NAND circuit 7*c* for calculating a logic product of the discharge control signal and the inverted discharge control signal. The output of the NAND circuit 7*c* is supplied to the discharge control circuit 6 as the discharge timing control signal.

Next, the writing operation of the data will be described with reference to the timing charts of FIGS. 6A to 6F.

The operation of the semiconductor memory device in the third embodiment is basically the same as that of the semiconductor memory device in the second embodiment. Therefore, the operation of the semiconductor memory device in the third embodiment which is different from the semiconductor memory device in the second embodiment will be described below.

The output of the discharging operation period control circuit 7 is supplied to the discharge control circuit 6 as the discharge timing control signal, as described above. Therefore, the discharge timing control signal of the high level is supplied to the discharge control circuit 6 for a predetermined time period after the data lines DLT and DLN are selected by the data line selecting circuit 4 in response to the write control signal WE. The predetermined time period is determined based on a delay time of the delay circuit 7b.

Figure 9:
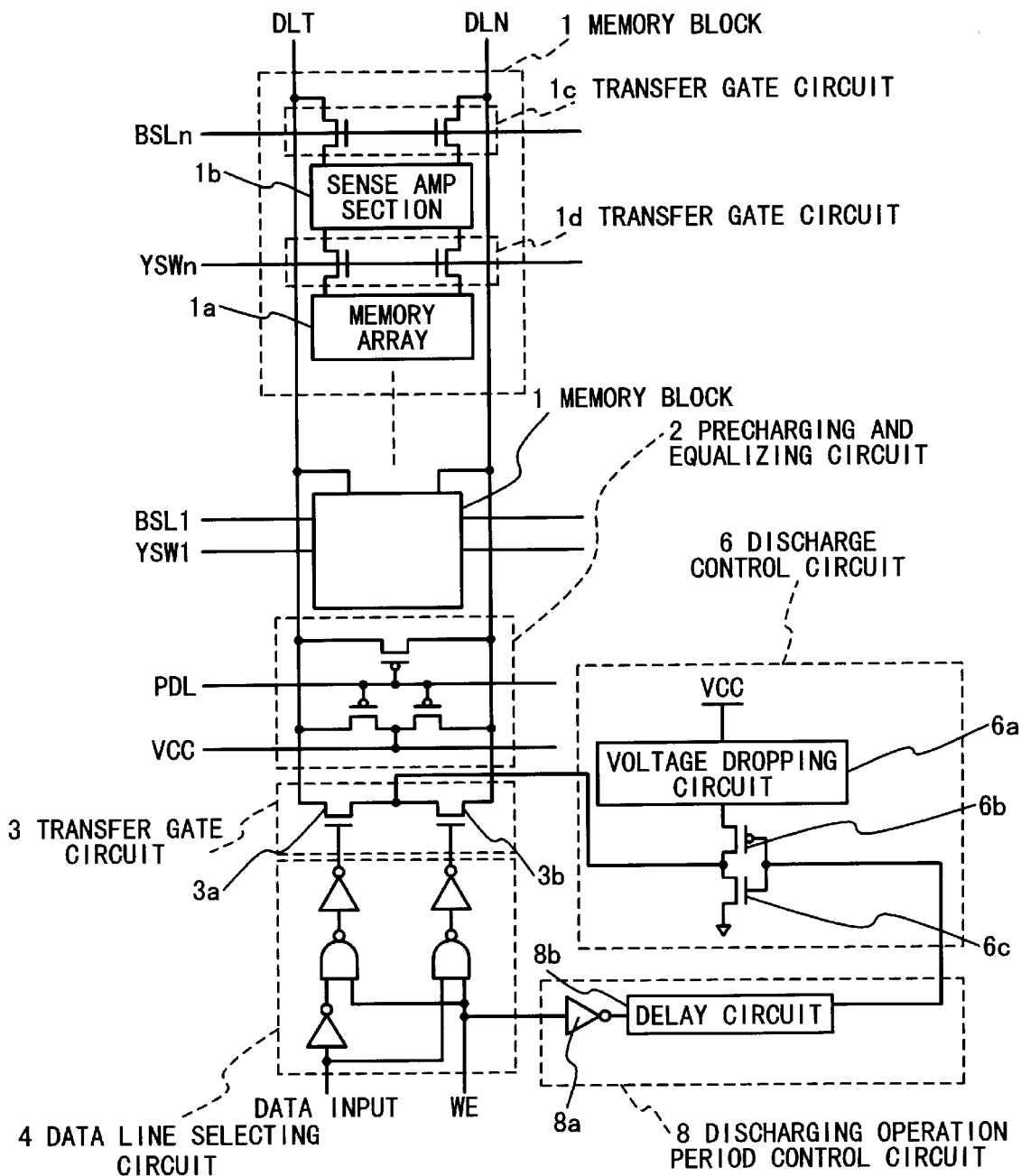
FIG. 9 is a block diagram showing the structure of the semiconductor memory device according to a fourth embodiment of the present invention.

Next, FIG. 9 shows a block diagram showing the structure of the semiconductor memory device according to the fourth embodiment of the present invention. The structure of the semiconductor memory device in the fourth embodiment is basically the same as that of the semiconductor memory device in the third embodiment. The semiconductor memory device in the fourth embodiment is different from the semiconductor memory device in the third embodiment in a discharging operation period control circuit 8. That is, the discharging operation period control circuit 8 is composed of an inverter 8a and a delay circuit 8b. Also, the write control signal WE is supplied to the discharging operation period control circuit 8. The write control signal WE is inverted by the inverter 8a and delayed by the delay circuit 8b. Then, the delayed write control signal is supplied to the discharge control circuit 6 as the discharge control signal. The time period during which the discharge control signal is in the low level is determined based on the delay time of the delay circuit 8b.

In the above embodiments, the description is given as the precharge voltage is the power supply voltage. However, the precharge voltage may be a voltage lower than the power supply voltage by a threshold voltage of a transistor or ½ of the power supply voltage. Also, it is desirable that the precharge voltage as the output voltage of the discharge control circuit is ½ of the power supply voltage. However, the discharge voltage is optional.

As described above, according to the present invention, when data is written in a memory block, the power consumption on the data lines drive can be largely reduced. Also, the writing operation can be speeded up.

What is claimed is:

1. A semiconductor memory device comprising:
   a pair of data lines;
   a precharging and equalizing circuit provided between said data lines to equally precharge said data lines to a first voltage in response to a precharge and equalize signal;
   a setting circuit provided between said data lines to set one of said precharged data lines to a second voltage in response to data signals, wherein said second voltage is lower than said first voltage, and a data is written to a memory cell based on said second voltage of said one precharged data line and said first voltage of said other precharged data line; and
   a data write circuit supplying said data signals to said setting circuit based on said data.

2. A semiconductor memory device according to claim 1, wherein said setting circuit comprises:
   a transfer gate provided between said data lines and including two transistors connected in series between said data lines, wherein gates of said two transistors are supplied with said data signals; and
   a discharge control circuit setting a voltage of a node between said two transistors to said second voltage.

3. A semiconductor memory device according to claim 1, wherein said setting circuit comprises:
   a transfer gate provided between said data lines and including two transistors connected in series between said data lines, wherein gates of said two transistors are supplied with said data signals; and
   a discharge control circuit setting a voltage of a node between said two transistors to said second voltage in response to a control signal.

4. A semiconductor memory device according to claim 3, wherein said discharge control circuit includes:
   a voltage dropping circuit generating said second voltage from said first voltage; and
   an inverter setting said voltage of said node to said second voltage in response to said control signal.

5. A semiconductor memory device according to claim 1, wherein said setting circuit comprises:
   a transfer gate provided between said data lines and including two transistors connected in series between said data lines, wherein gates of said two transistors are supplied with said data signals; and
   a discharge control circuit setting a voltage of a node between said two transistors to said second voltage in response to a control signal.

6. A semiconductor memory device according to claim 5, wherein said discharge control circuit includes:
   a voltage dropping circuit generating said second voltage from said first voltage;
   an inverter setting said voltage of said node to said second voltage in response to a period indication signal; and
   a period control circuit generating said period indication signal from said control signal to indicates a time period during which said one precharged data line is set to said second voltage.

7. A semiconductor memory device according to claim 1, wherein said data write circuit supplies said data signals to said setting circuit based on said data in response to a write control signal, and wherein said setting circuit comprises:
   a transfer gate provided between said data lines and including two transistors connected in series between said data lines, wherein gates of said two transistors are supplied with said data signals; and
   a discharge control circuit setting a voltage of a node between said two transistors to said second voltage in response to said write control signal.

8. A semiconductor memory device according to claim 7, wherein said discharge control circuit includes:
   a voltage dropping circuit generating said second voltage from said first voltage;
   an inverter setting said voltage of said node to said second voltage in response to a period indication signal; and
   a period control circuit generating said period indication signal from said write control signal to indicates a time period during which said one precharged data line is set to said second voltage.

9. A semiconductor memory device according to claim 1, wherein said first voltage is a power supply voltage.

10. A semiconductor memory device according to claim 9, wherein said second voltage is substantially equal to ½ of said power supply voltage.

11. A semiconductor memory device according to claim 1, wherein said first voltage is a voltage lower than a power supply voltage by a threshold voltage of a transistor of said precharging and equalizing circuit.

12. A semiconductor memory device according to claim 11, wherein said second voltage is substantially equal to ½ of the power supply voltage.

13. A semiconductor memory device according to claim 1, wherein said first voltage is substantially equal to ½ of a power supply voltage.

14. A method of writing a data in a semiconductor memory device, comprising:
- equally precharging a pair of data lines to a first voltage in response to a precharge and equalize signal;
- supplying data signals based on said data in response to a write control signal;
- setting one of said precharged data lines to a second voltage in response to said data signals, said second voltage being lower than said first voltage; and
- sensing voltages on said data lines to write said data in a memory cell based on said sensed voltages.

15. A method according to claim 14, wherein said setting includes:
- supplying said data signals to gates of two transistors which are connected in series between said data lines; and
- connecting a node between said two transistors to said second voltage.

16. A method according to claim 14, wherein said setting includes:
- supplying said data signals to gates of two transistors which are connected in series between said data lines; and
- connecting a node between said two transistors to said second voltage in response to a control signal.

17. A method according to claim 14, wherein said setting includes:
- supplying said data signals to gates of two transistors which are connected in series between said data lines;
- generating a period indication signal from a control signal to indicates a time period during which said one precharged data line is set to said second voltage; and
- connecting a node between said two transistors to said second voltage in response to said period indication signal.

18. A method according to claim 14, wherein said setting includes:
- supplying said data signals to gates of two transistors which are connected in series between said data lines;
- generating a period indication signal from said write control signal to indicates a time period during which said one precharged data line is set to said second voltage; and
- connecting a node between said two transistors to said second voltage In response to said write control signal.

19. A method according to claim 14, wherein said first voltage Is substantially equal to a power supply voltage.

20. A method according to claim 14, wherein said second voltage is substantially equal to ½ of said first voltage.

21. A method according to claim 14, wherein said first voltage Is substantially equal to ½ of a power supply voltage.

* * * * *

UNITED STATES PATENT AND TRADEMARK OFFICE
CERTIFICATE OF CORRECTION

PATENT NO.   : 6,212,120 B1
DATED        : April 3, 2001
INVENTOR(S)  : Nakamura et al.

It is certified that error appears in the above-identified patent and that said Letters Patent is hereby corrected as shown below:

Column 12,
Line 20, "In" should be -- in --
Line 22, "Is" should be -- is --
Line 26, "Is" should be -- is --

Signed and Sealed this

Thirtieth Day of April, 2002

Attest:

Attesting Officer

JAMES E. ROGAN
Director of the United States Patent and Trademark Office